(12) United States Patent
Su et al.

(10) Patent No.: US 11,652,077 B2
(45) Date of Patent: May 16, 2023

(54) LIGHT-EMITTING DISPLAY UNIT AND DISPLAY APPARATUS

(71) Applicant: PlayNitride Display Co., Ltd., MiaoLi County (TW)

(72) Inventors: Po-Jen Su, MiaoLi County (TW); Wei-Ping Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 261 days.

(21) Appl. No.: 17/184,513

(22) Filed: Feb. 24, 2021

(65) Prior Publication Data
US 2022/0059510 A1 Feb. 24, 2022

Related U.S. Application Data

(60) Provisional application No. 63/069,693, filed on Aug. 24, 2020.

(30) Foreign Application Priority Data

Dec. 29, 2020 (TW) ................................. 109146585

(51) Int. Cl.
*H01L 23/00* (2006.01)
*H01L 25/075* (2006.01)
(Continued)

(52) U.S. Cl.
CPC .............. *H01L 24/26* (2013.01); *H01L 24/18* (2013.01); *H01L 25/0753* (2013.01);
(Continued)

(58) Field of Classification Search
CPC ..... H01L 24/18; H01L 24/26; H01L 25/0753; H01L 33/62; H01L 33/60; H01L 24/16; H01L 2224/16227
See application file for complete search history.

(56) References Cited

U.S. PATENT DOCUMENTS

| 2015/0282307 | A1 | 10/2015 | Shimizu et al. |
| 2017/0372991 | A1 | 12/2017 | Tsukamoto et al. |
| 2020/0205279 | A1* | 6/2020 | Ecton ................... H05K 1/0218 |

FOREIGN PATENT DOCUMENTS

| CN | 104659162 | 5/2015 |
| CN | 106684108 | 5/2017 |

(Continued)

OTHER PUBLICATIONS

"Office Action of Korea Counterpart Application", dated Oct. 18, 2022, p. 1-p. 19.

(Continued)

*Primary Examiner* — Feifei Yeung Lopez
(74) *Attorney, Agent, or Firm* — JCIPRNET

(57) ABSTRACT

A light-emitting display unit including first to third metal layers, first to second insulation layers and micro light-emitting devices is provided. The first metal layer has conductive patterns. The second metal layer has transfer patterns. The third metal layer has pad patterns. The second metal layer is located between the first metal layer and the third metal layer. A distribution density of the first metal layer is less than that of the second metal layer, and greater than that of the third metal layer. The first insulation layer is disposed between the first metal layer and the second metal layer. The second insulation layer is disposed between the second metal layer and the third metal layer. The micro light-emitting devices are disposed on one side of the first metal layer away from the second metal layer, and electrically bonded to the conductive patterns. A display apparatus adopting the light-emitting display unit is also provided.

19 Claims, 9 Drawing Sheets

(51) Int. Cl.
*H01L 33/62* (2010.01)
*H01L 33/60* (2010.01)
(52) U.S. Cl.
CPC .............. *H01L 33/62* (2013.01); *H01L 24/16* (2013.01); *H01L 33/60* (2013.01); *H01L 2224/16227* (2013.01)

(56) References Cited

FOREIGN PATENT DOCUMENTS

| | | |
|---|---|---|
| CN | 111343794 | 6/2020 |
| JP | 2002344135 | 11/2002 |
| JP | 2005140938 | 6/2005 |
| JP | 2020088383 | 6/2020 |
| KR | 20100002663 | 1/2010 |
| KR | 20150049669 | 5/2015 |
| KR | 20180115272 | 10/2018 |
| KR | 20190006430 | 1/2019 |
| WO | 2019192047 | 10/2019 |
| WO | 2020098034 | 5/2020 |

OTHER PUBLICATIONS

"Office Action of China Counterpart Application", dated Jul. 28, 2022, p. 1-p. 7.

* cited by examiner

LIGHT-EMITTING DISPLAY UNIT AND DISPLAY APPARATUS

CROSS-REFERENCE TO RELATED APPLICATION

This application claims the priority benefits of U.S. provisional application Ser. No. 63/069,693, filed on Aug. 24, 2020, and Taiwan application serial no. 109146585, filed on Dec. 29, 2020. The entirety of each of the above-mentioned patent applications is hereby incorporated by reference herein and made a part of this specification.

BACKGROUND

Technical Field

The invention relates to a self-luminous display technology, and particularly relates to a light-emitting display unit and a display apparatus.

Description of Related Art

In recent years, under the situation that manufacturing cost of organic light-emitting diode (OLED) display panel is too high and a service life thereof cannot compete with current mainstream displays, micro LED displays have gradually attracted investment attentions of major technology manufacturers. The micro LED display has optical performance equivalent to an OLED display technology, such as high color saturation, a fast response speed and a high contrast, and has advantages of low energy consumption and long service life of materials. Generally, the manufacturing technology of the micro LED display adopts a method of chip transposition to directly transfer pre-made micro LED chips to a driving circuit backplane. Although such kind of mass transfer technology has development advantages in manufacturing of large-scale products, improvement of a production yield is an important indicator of current related process technology and equipment development.

According to the existing technology, a technology that uses a hard electrostatic tip for chip transposition has high requirements for flatness of a bonding surface of a target substrate (such as a circuit backplane) (for example, the flatness is less than 1 μm). Therefore, it is hard to meet the needs of large-area transfer. Another technology that uses soft patterned stamps for chip transposition has low requirements on the flatness of the target substrate (for example, less than 5 μm), but its ability to withstand processes of high temperature and pressure is poor. Therefore, it is not suitable for a transfer bonding process of flip-chip type LED chips. In other words, the chip transfer technology that may simultaneously meet the needs of large-area transfer and mass production is still required to be developed.

SUMMARY

The invention is directed to a light-emitting display unit, which has a better transposition (transferring and positioning) yield.

The invention is directed to a display apparatus, which has a better production yield and a larger design margin of an overall circuit.

The invention provides a light-emitting display unit including a first metal layer, a second metal layer, a third metal layer, a first insulation layer, a second insulation layer and a plurality of micro light-emitting devices. The first metal layer has a plurality of conductive patterns. The second metal layer has a plurality of transfer patterns electrically connected to the conductive patterns. The third metal layer has a plurality of pad patterns electrically connected to the transfer patterns. The second metal layer is located between the first metal layer and the third metal layer. A distribution density of the second metal layer is greater than a distribution density of the first metal layer, and the distribution density of the first metal layer is greater than a distribution density of the third metal layer. The first insulation layer is disposed between the first metal layer and the second metal layer. The second insulation layer is disposed between the second metal layer and the third metal layer. The micro light-emitting devices are disposed on one side of the first metal layer away from the second metal layer, and are electrically bonded to the conductive patterns. A ratio of a length to a thickness of each micro light-emitting device is greater than one.

In an embodiment of the invention, the first insulation layer of the light-emitting display unit has a plurality of first contact windows. The conductive patterns are electrically connected to the transfer patterns through the first contact windows. The second insulation layer has a plurality of second contact windows, and the transfer patterns are electrically connected to the pad patterns through the second contact windows. A number of the first contact windows of the first insulation layer is greater than a number of the second contact windows of the second insulation layer.

In an embodiment of the invention, the first contact windows and the second contact windows of the light-emitting display unit are not overlapped with the micro light-emitting devices.

In an embodiment of the invention, the light-emitting display unit further includes a protective layer, which is disposed on one side of the third metal layer away from the second metal layer, and has a plurality of openings. The openings of the protective layer expose a part of a surface of the third metal layer. Orthogonal projections of the micro light-emitting devices on the third metal layer are overlapped with the openings.

In an embodiment of the invention, a thickness of the protective layer of the light-emitting display unit in a thickness direction is greater than a thickness of each of the first insulation layer and the second insulation layer in the thickness direction, and the thickness of each of the first insulation layer and the second insulation layer in the thickness direction is greater than or equal to a thickness of each of the first metal layer, the second metal layer and the third metal layer in the thickness direction.

In an embodiment of the invention, a thickness of the first metal layer in the thickness direction of the light-emitting display unit is less than a thickness of each of the second metal layer and the third metal layer in the thickness direction.

In an embodiment of the invention, a percentage of an orthogonal projection area of each of the first metal layer and the second metal layer on a light-emitting surface of the light-emitting display unit to an area of the light-emitting surface is greater than or equal to 70%.

In an embodiment of the invention, a percentage of an orthogonal projection area of the third metal layer on a light-emitting surface of the light-emitting display unit to an area of the light-emitting surface is less than 50% and greater than 25%.

In an embodiment of the invention, the light-emitting display unit further includes an isolation structure disposed on one side of the first metal layer provided with the micro light-emitting devices. The isolation structure has a plurality of openings, and the micro light-emitting devices are respectively disposed in the openings of the isolation structure. A thickness of the isolation structure in a thickness direction is greater than or equal to a thickness of the micro light-emitting devices in the thickness direction.

In an embodiment of the invention, a thickness of the isolation structure of the light-emitting display unit in the thickness direction is equal to a thickness of the protective layer in the thickness direction.

In an embodiment of the invention, a percentage of an orthogonal projection area of the isolation structure of the light-emitting display unit on a light-emitting surface of the light-emitting display unit to an area of the light-emitting surface is greater than or equal to 70%.

In an embodiment of the invention, the micro light-emitting devices of the light-emitting display unit are respectively located in a plurality of pixel regions of the light-emitting display unit, and each pixel region has at least three micro light-emitting devices. A number of the pixel regions arranged in a first direction is M, and a number of the pixel regions arranged in a second direction is N. The first direction is intersected with the second direction, and a number of the second contact windows of the second insulation layer is M+3N.

In an embodiment of the invention, the light-emitting display unit further includes a substrate and an adhesive layer. The substrate is overlapped with the micro light-emitting devices, and the micro light-emitting devices are located between the substrate and the first metal layer. The adhesive layer connects the substrate, these micro light-emitting devices and a part of a surface of the first metal layer.

In an embodiment of the invention, the first metal layer of the light-emitting display unit further has a plurality of dummy patterns, and the dummy patterns are electrically insulated from the conductive patterns.

In an embodiment of the invention, a stacked structure within an orthogonal projection range of each of the micro light-emitting devices on the corresponding pad pattern is the same.

The invention provides a display apparatus including a printed circuit board and a plurality of light-emitting display units. The light-emitting display units are electrically bonded to the printed circuit board. Each of the light-emitting display units includes a first metal layer, a second metal layer, a third metal layer, a first insulation layer, a second insulation layer and a plurality of micro light-emitting devices. The first metal layer has a plurality of conductive patterns. The second metal layer has a plurality of transfer patterns electrically connected to the conductive patterns. The third metal layer has a plurality of pad patterns electrically connected to the transfer patterns. The second metal layer is located between the first metal layer and the third metal layer. A distribution density of the second metal layer is greater than a distribution density of the first metal layer, and the distribution density of the first metal layer is greater than a distribution density of the third metal layer. The first insulation layer is disposed between the first metal layer and the second metal layer. The second insulation layer is disposed between the second metal layer and the third metal layer. The micro light-emitting devices are disposed on one side of the first metal layer away from the second metal layer, and are electrically bonded to the conductive patterns. A ratio of a length to a thickness of each micro light-emitting device is greater than one.

In an embodiment of the invention, the printed circuit board of the display apparatus has a plurality of solder bumps, and the pad patterns of the light-emitting display units are electrically bonded to the printed circuit board through the solder bumps.

In an embodiment of the invention, each of the light-emitting display units of the display apparatus further includes a protective layer, which is disposed on one side of the third metal layer away from the second metal layer. The protective layer directly covers a part of a surface of the pad patterns of the third metal layer, and a plurality of openings of the protective layer expose another part of the surface of the pad patterns. The solder bumps respectively extend into the openings of the protective layer to connect the pad patterns.

In an embodiment of the invention, a percentage of an orthogonal projection area of the protective layer of the display apparatus on a surface of the pad patterns to an area of the surface of the pad patterns is between 20% and 50%.

Based on the above description, in the light-emitting display unit of an embodiment of the invention, the conductive patterns of the first metal layer are electrically connected to the pad patterns of the third metal layer through the transfer patterns of the second metal layer, respectively. Based on the fact that the distribution density of the second metal layer is greater than the distribution density of the first metal layer and the distribution density of the third metal layer, and the distribution density of the first metal layer is greater than the distribution density of the third metal layer, a surface flatness of the light-emitting unit configured with the conductive patterns may be effectively increased, and a transposition (transferring and positioning) yield of the micro light-emitting devices is therefore improved. A plurality of the light-emitting display units are adapted to be electrically connected to the printed circuit board through the respective pad patterns to form a display apparatus. The pre-made light-emitting display units may simplify the circuit layers disposed on the printed circuit board, making the display apparatus lighter and thinner. In a manufacturing process of the display apparatus, to transfer multiple light-emitting display units is more efficient and easier than transferring multiple micro light-emitting devices, and it may also reduce the difficulty of repairing a large-size display apparatus (for example: light-emitting inspection may be directly performed on the light-emitting display unit, and if there is a defective spot, it may be directly repaired to ensure that the micro light-emitting devices on the light-emitting display units function normally; then, each of the light-emitting display units passing the inspection is bonded to the printed circuit board through the respective pad patterns to form the display apparatus). The production yield of the display apparatus is accordingly improved. On the other hand, by configuring the metal layers of the light-emitting display unit, a design margin of the overall circuit of the display apparatus is effectively increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
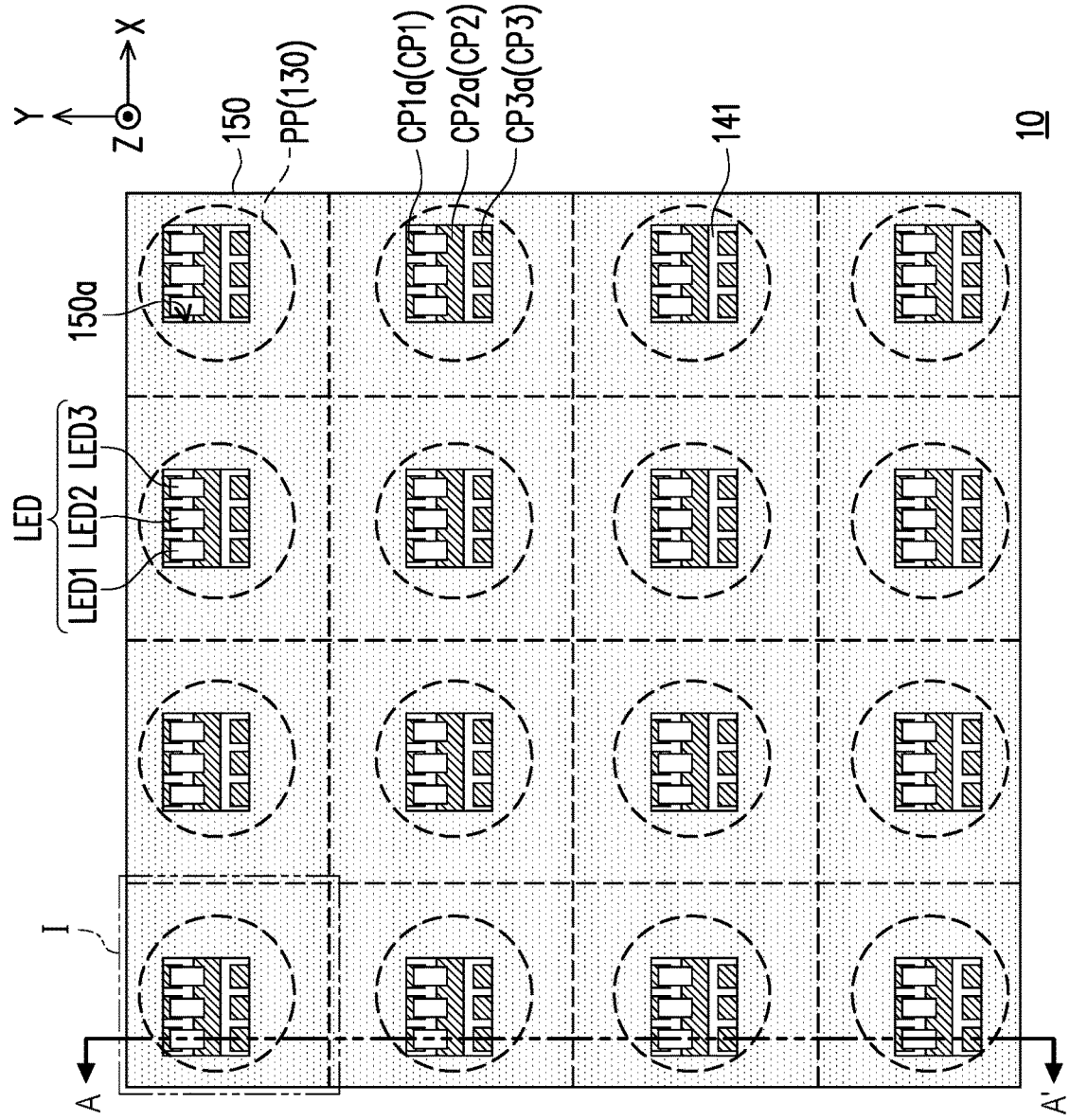
FIG. 1 is a schematic top view of a light-emitting display unit according to an embodiment of the invention.

In the drawings, thicknesses of layers, films, panels, regions, etc., are exaggerated for clarity's sake. It should be noted that when an element such as a layer, a film, a region, or a substrate is referred to as being "on" or "connected" to another element, the element may be directly on or connected to the other element, or an intermediate element may exist. In contrast, when an element is referred to as being "directly on" or "directly connected to" another element, no intermediate element exists. As used herein, "connection" may refer to physical and/or electrical connection. Furthermore, "electrical connection" means that there may be other components between two components.

Reference will now be made in detail to the present preferred embodiments of the invention, examples of which are illustrated in the accompanying drawings. Wherever possible, the same reference numbers are used in the drawings and the description to refer to the same or like parts.

Figure 2:
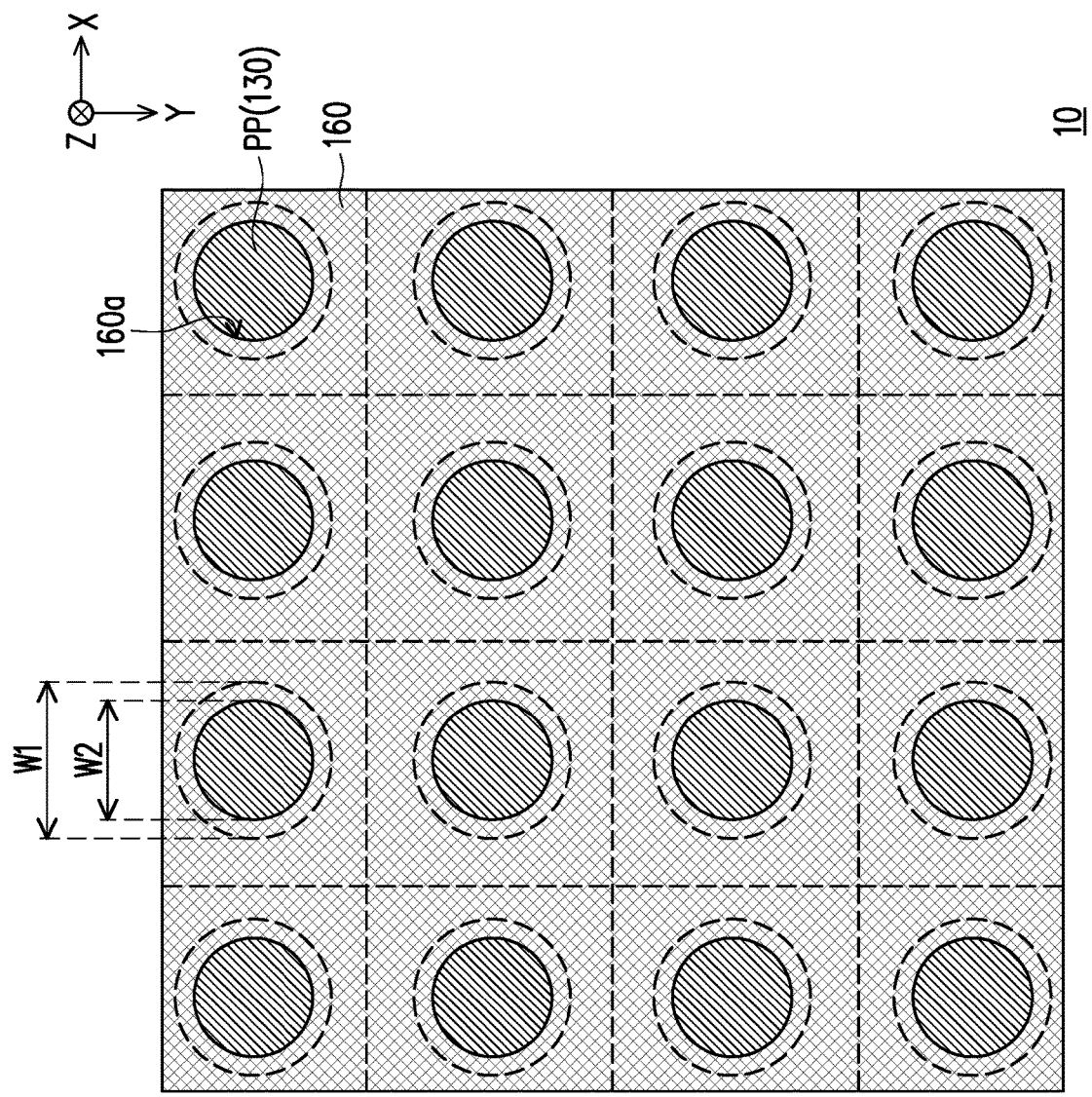
FIG. 2 is a schematic bottom view of the light-emitting display unit of FIG. 1.
Figure 3:
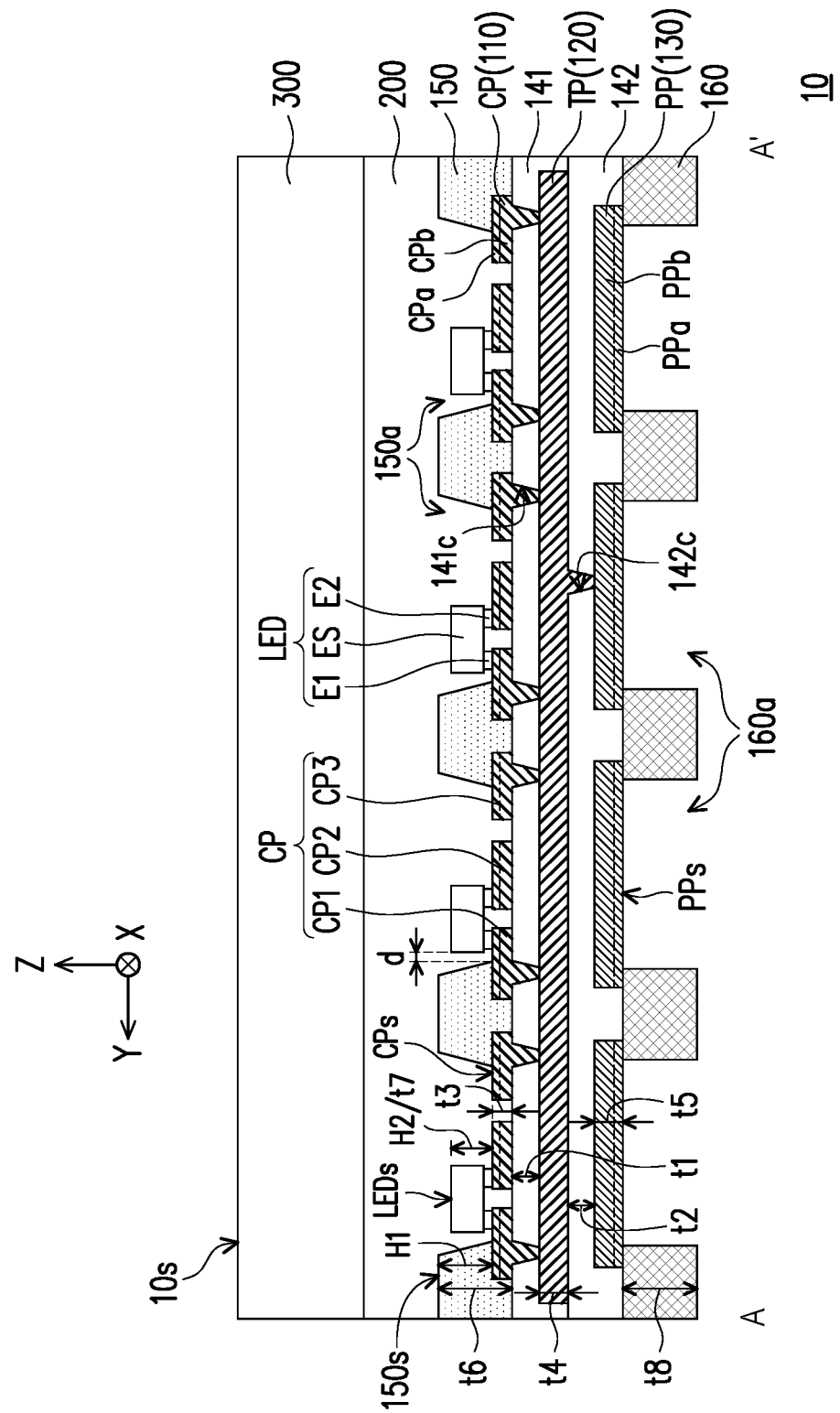
FIG. 3 is a schematic cross-sectional view of the light-emitting display unit of FIG. 1.
Figure 4:
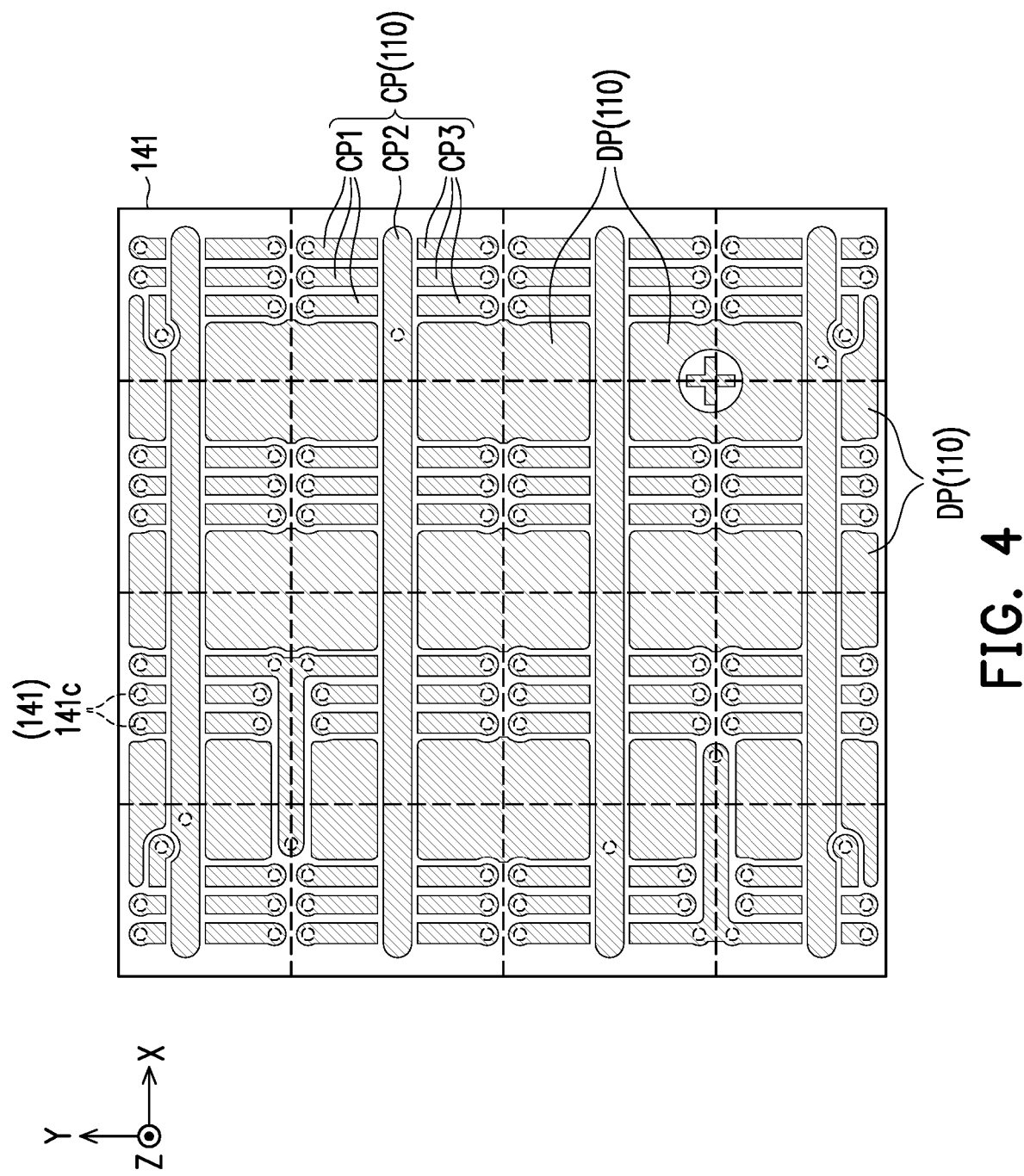
FIG. 4 is a schematic top view of a first metal layer and a first insulation layer of FIG. 3.
Figure 5:
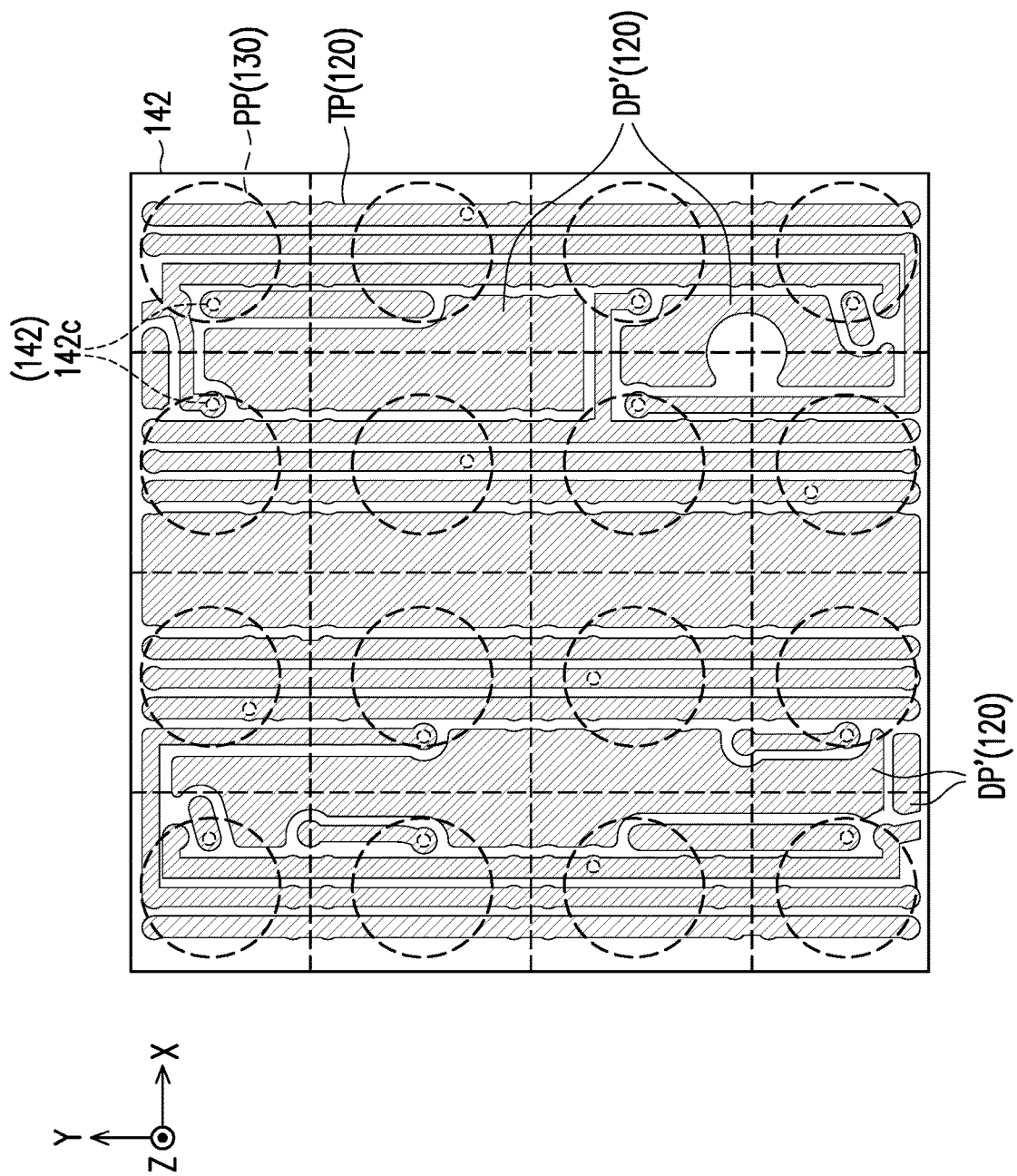
FIG. 5 is a schematic top view of a second metal layer, a third metal layer, and a second insulation layer of FIG. 3.
Figure 6:
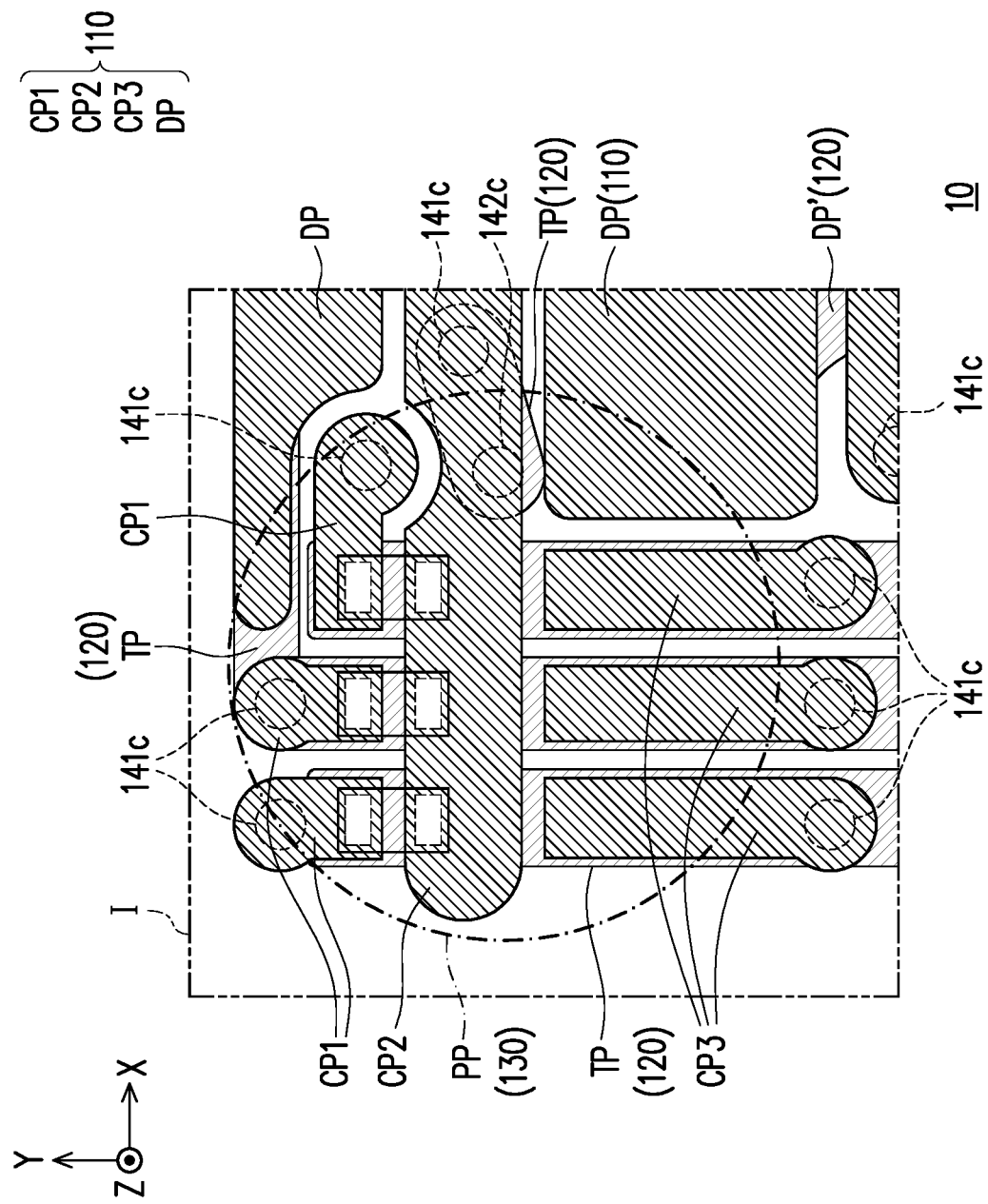
FIG. 6 is an enlarged schematic diagram of a partial region of the light-emitting display unit of FIG. 1.
Figure 7:
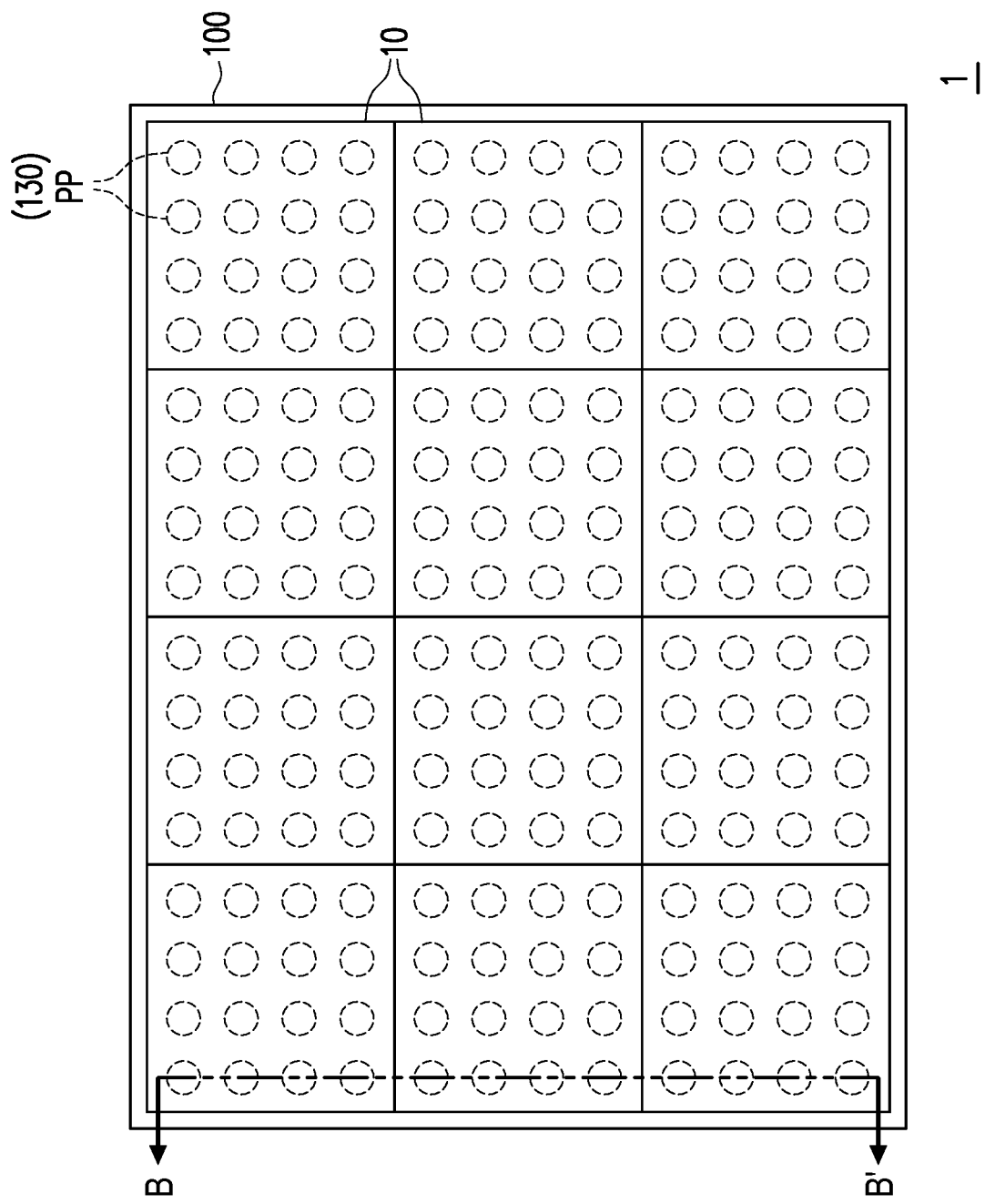
FIG. 7 is a schematic top view of a display apparatus according to an embodiment of the invention.
Figure 8:
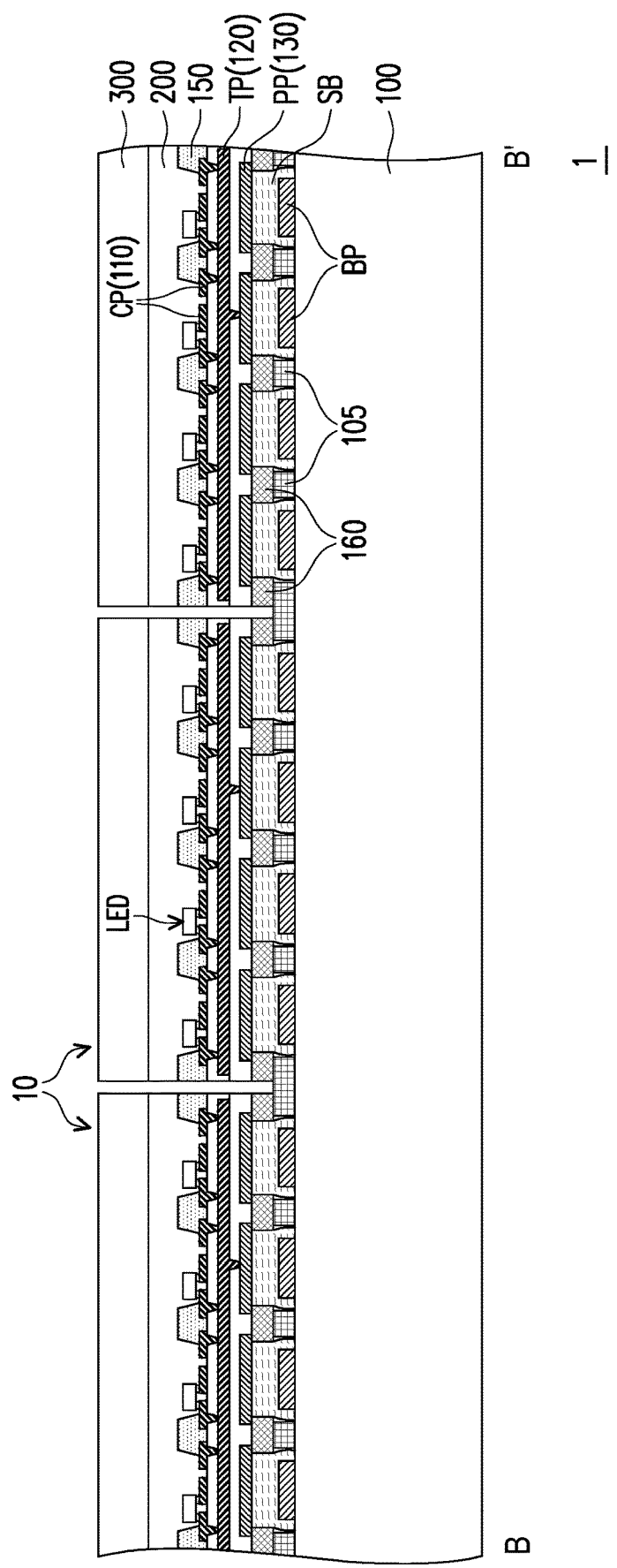
FIG. 8 is a schematic cross-sectional view of the display apparatus of FIG. 7.

FIG. 1 is a schematic top view of a light-emitting display unit according to an embodiment of the invention. FIG. 2 is a schematic bottom view of the light-emitting display unit of FIG. 1. FIG. 3 is a schematic cross-sectional view of the light-emitting display unit of FIG. 1. FIG. 4 is a schematic top view of a first metal layer and a first insulation layer of FIG. 3. FIG. 5 is a schematic top view of a second metal layer, a third metal layer, and a second insulation layer of FIG. 3. FIG. 6 is an enlarged schematic diagram of a partial region of the light-emitting display unit of FIG. 1. FIG. 7 is a schematic top view of a display apparatus according to an embodiment of the invention. FIG. 8 is a schematic cross-sectional view of the display apparatus of FIG. 7. Particularly, FIG. 3 corresponds to a section line A-A' of FIG. 1; FIG. 6 corresponds to a region I of FIG. 1; and FIG. 8 corresponds to a section line B-B' of FIG. 7.

Referring to FIG. 1 and FIG. 3, the light-emitting display unit 10 includes a first metal layer 110, a second metal layer 120, a third metal layer 130, a first insulation layer 141, a second insulation layer 142, and a plurality of micro light-emitting devices LED. The second metal layer 120 is located between the first metal layer 110 and the third metal layer 130. The first insulation layer 141 is disposed between the first metal layer 110 and the second metal layer 120. The second insulation layer 142 is disposed between the second metal layer 120 and the third metal layer 130.

In detail, the first metal layer 110 has a plurality of conductive patterns CP. The second metal layer 120 has a plurality of transfer patterns TP. The third metal layer 130 has a plurality of pad patterns PP. The first insulation layer 141 has a plurality of first contact windows 141c. The second insulation layer 142 has a plurality of second contact windows 142c. The conductive patterns CP of the first metal layer 110 are electrically connected to the transfer patterns TP of the second metal layer 120 through the first contact windows 141c of the first insulation layer 141. The transfer patterns TP of the second metal layer 120 are electrically connected to the pad patterns PP of the third metal layer 130 through the second contact windows 142c of the second insulation layer 142. Namely, the conductive patterns CP of the first metal layer 110 are electrically connected to the pad patterns PP of the third metal layer 130, respectively.

Based on consideration of conductivity, materials of the first metal layer 110, the second metal layer 120 and the third metal layer 130 may be selected from molybdenum, aluminum, copper, gold, or a combination of thereof, or other suitable metal materials. In the embodiment, the materials of the metal layers may be selectively the same or different. Materials of the first insulation layer 141 and the second insulation layer 142 may include silicon oxide, silicon nitride, oxynitride, polyimide, polyethylene, polypropylene, acrylic, a ceramic material, or other suitable organic/inorganic materials.

A plurality of micro light-emitting devices LED are arranged on one side of the first metal layer 110 away from the second metal layer 120, and are electrically connected to the conductive patterns CP of the first metal layer 110, respectively. In order to increase a surface flatness of the light-emitting display unit 10 configured with the conductive patterns CP, a respective distribution density of the first metal layer 110 and the second metal layer 120 is greater than a distribution density of the third metal layer 130, and the distribution density of the second metal layer 120 is greater than the distribution density of the first metal layer 110. To be specific, a percentage of an orthogonal projection area of each of the first metal layer 110 and the second metal layer 120 on a light-emitting surface 10s of the light-emitting display unit 10 to a surface area of the light-emitting surface 10s is greater than or equal to 70%, which may effectively improve a transposition (transferring and positioning) yield of the micro light-emitting devices LED. On the other hand, a percentage of an orthogonal projection area of the third metal layer 130 on the light-emitting surface 10s of the light-emitting display unit 10 to the surface area of the light-emitting surface 10s is less than 50% and greater than 25%, which may avoid a peeling phenomenon of the surrounding second insulation layer 142.

For example, in the embodiment, a percentage of the orthogonal projection area of the first metal layer 110 on the light-emitting surface 10s of the light-emitting display unit 10 to the surface area of the light-emitting surface 10s is 70% (as shown in FIG. 4), a percentage of the orthogonal projection area of the second metal layer 120 on the light-emitting surface 10s of the light-emitting display unit 10 to the surface area of the light-emitting surface 10s is 72% (as shown in FIG. 5), and a percentage of the orthogonal projection area of the third metal layer 130 on the light-emitting surface 10s of the light-emitting display unit 10 to the surface area of the light-emitting surface 10s is 33% (as shown in FIG. 5), but the invention is not limited thereto.

It should be noted that in the embodiment, the first contact windows 141c of the first insulation layer 141 and the second contact windows 142c of the second insulation layer 142 may not be overlapped with the micro light-emitting devices LED (as shown in FIG. 6) in an overlap direction (for example, a direction Z) of the metal layers, so as to further increase flatness of a part of a surface of the conductive patterns CP used for bonding the micro light-emitting devices LED, thereby improving the transposition yield of the micro light-emitting devices LED.

On the other hand, based on a fact that a thickness t1 and a thickness t2 of the first insulation layer 141 and the second insulation layer 142 in a thickness direction (for example, the direction Z) are greater than a thickness t3, a thickness t4 and a thickness t5 of the first metal layer 110, the second metal layer 120, and the third metal layer 130 in the thickness direction, it further increases flatness of a part of a surface of the conductive patterns CP used for bonding the micro light-emitting devices LED, but the invention is not limited thereto. In other embodiments, a film thickness relationship between the insulation layers and the metal layers may be adjusted according to actual product specifications (such as an overall thickness or flexibility). For example, the aforementioned thickness t1 and thickness t2 may also be equal to the aforementioned thickness t3, thickness t4, and thickness t5.

In addition, since the flatness of the surfaces of the metal layers will become worse along with the increase of its own film thickness, the thickness t3 of the first metal layer 110 is limited to a thinner film thickness range (for example, greater than or equal to 2 μm and less than 4 μm), which may further ensure a better surface flatness of the conductive pattern CP. In the embodiment, the thickness t4 of the second metal layer 120 and the thickness t5 of the third metal layer 130 may be between 4 μm and 8 μm. Namely, the thickness t3 of the first metal layer 110 in the embodiment may be selectively less than the thickness t4 of the second metal layer 120 and the thickness t5 of the third metal layer 130, but the invention is not limited thereto. In other embodiments, the film thickness of the first metal layer may also be equal to the film thickness of the second metal layer 120 (or the third metal layer 130).

It should be noted that the conductive pattern CP of the first metal layer 110 may be a stack structure of a plurality of sub-layers. In the embodiment, the conductive pattern CP is a stack structure of a first sub-layer CPa and a second sub-layer CPb, and the second sub-layer CPb is located between the first sub-layer CPa and the first insulation layer 141. A material of the first sub-layer CPa may be selected from molybdenum or gold, and a material of the second sub-layer CPb may be selected from metal materials other than molybdenum or gold, such as aluminum, copper, or a combination thereof, or other suitable metal materials. For example, the first sub-layer CPa and the second sub-layer CPb of the conductive pattern CP may be respectively a gold-plated layer and a copper layer, and the first sub-layer CPa may be implemented by an electroless palladium immersion gold (EPIG) process, but the invention is not limited thereto.

Similarly, the pad pattern PP of the third metal layer 130 may also be a stack structure of a first sub-layer PPa and a second sub-layer PPb, and the second sub-layer PPb is located between the second insulation layer 142 and the first sub-layer PPa. Since material selection and manufacturing method of the pad pattern PP are similar to that of the conductive pattern CP of the first metal layer 110, the above paragraph may be referred for detailed description thereof, which is not be repeated here.

On the other hand, in the embodiment, in order to ensure that each of the micro light-emitting devices LED may be effectively transposed and electrically bonded to the conductive patterns CP of the first metal layer 110, within an orthogonal projection range of each micro light-emitting device LED on the corresponding pad pattern PP, the stacked structures are substantially the same. For example, a thickness of any film layer (for example, the first insulation layer 141 and the second insulation layer 142) or structure (for example, the conductive pattern CP, the transfer pattern TP, and the pad pattern PP) covered by each micro light-emitting device LED in a bonding direction (for example, the direction Z) is designed to be substantially the same.

Moreover, an orthogonal projection contour and an orthogonal projection area of any film layer or structure covered by each micro light-emitting device LED on a horizontal plane parallel to a top surface LEDs of the micro light-emitting device LED are designed to be substantially the same. In this way, each surface configured with the micro light-emitting device LED is ensured to be flat, so that the micro light-emitting devices LED may have a higher transfer yield during a transposing process.

In the embodiment, the light-emitting display unit 10 may also selectively include an isolation structure 150, which is disposed on one side of the first metal layer 110 configured with the micro light-emitting devices LED. For example, the isolation structure 150 is disposed on the first metal layer 110 and covers a part of the surface of the first insulation layer 141 and a part of the surface of the conductive patterns CP. The isolation structure 150 has a plurality of openings 150a separated from each other, and the micro light-emitting devices LED are respectively disposed in the openings 150a. In the embodiment, the openings 150a are respectively arranged in a plurality of rows and a plurality of columns in a direction X and a direction Y. Namely, the openings 150a are arranged on the first metal layer 110 in an array. In the embodiment, orthogonal projection contours of the openings 150a on the light-emitting surface 10s of the light-emitting display unit 10 may be rectangles.

It should be noted that a percentage of an orthogonal projection area of the isolation structure 150 on the light-emitting surface 10s of the light-emitting display unit 10 to the surface area of the light-emitting surface 10s is greater than or equal to 70%. In this way, the micro light-emitting devices LED in the adjacent openings 150a are effectively prevented from being interfered by the light emitted from each other. For example, in the embodiment, the openings 150a of the isolation structure 150 are formed by a photolithography process. However, the invention is not limited thereto, and in other embodiments, the isolation structure may also fill gaps between the micro light-emitting devices LED. In other words, the isolation structure may also be fabricated without using the photolithography process.

In the embodiment, the isolation structure 150 and any micro light-emitting device LED in each opening 150a may have the shortest distance, for example, a distance d in the direction Y (as shown in FIG. 3), and the distance d may be equal to or less than 50 μm. In this way, among the light emitted by the micro light-emitting devices LED, the light with a larger light-emitting angle (i.e., the light with a light path largely deviating from the direction Z) may be effectively absorbed or blocked by the isolation structure 150, thereby effectively preventing the light from different pixel regions (or openings 150a) from interfering with each other.

A material of the isolation structure 150 includes, for example, a (black or green) resin material, a colloidal material doped with absorbing particles (for example: carbon powder, vinyl), a metal material (for example: silver, aluminum, titanium), a colloidal material doped with reflective particles (for example: silicon dioxide, titanium dioxide, etc.), but the invention is not limited thereto.

Particularly, the openings 150a of the isolation structure 150 may define a plurality of pixel regions of the light-emitting display unit 10, and a light-emitting brightness and a lighting-emitting color of each pixel region may be controlled by at least one micro light-emitting device LED in the same pixel region. In the embodiment, a number of the micro light-emitting devices LED provided in the same opening 150a (or pixel region) is, for example, three, but it does not mean that the invention is limited by the content of the drawings. In other embodiments, the number of the micro light-emitting devices LED in the same opening 150a may be adjusted to one, two, or four or more according to an actual optical design (such as a light-emitting wavelength) or product specifications (such as a light-emitting brightness).

It should be noted that in the embodiment, a thickness t6 of the isolation structure 150 in the thickness direction (for example, the direction Z) is significantly greater than a thickness t7 of the micro light-emitting device LED in the thickness direction, and a height H1 of a top surface 150s of the isolation structure 150 relative to a surface CPs of the conductive pattern CP (or the first metal layer 110) is greater than a height H2 of the top surface LEDs of the micro light-emitting device LED relative to the surface CPs of the conductive pattern CP. In this way, the light emitted by the micro light-emitting device LED in any pixel region may be prevented from emitting from the adjacent pixel region to cause unexpected light mixing, resulting in decrease in display contrast. In other words, through the shielding (for example, absorption or reflection) of the isolation structure 150, the display quality of the light-emitting display unit 10 may be effectively improved.

In the embodiment, the light-emitting display unit 10 may include a plurality of first micro light-emitting devices LED1, a plurality of second micro light-emitting devices LED2 and a plurality of third micro light-emitting devices LED3, and each pixel region (or opening 150a) is provided with one first micro light-emitting device LED1, one second micro light-emitting device LED2 and one third micro light-emitting device LED3. For example, the light-emitting colors of the first micro light-emitting device LED1, the second micro light-emitting device LED2, and the third micro light-emitting device LED3 are respectively red, green, and blue, and by configuring a ratio of light intensities of the micro light-emitting devices, display effects of different gray scales are achieved. However, the invention is not limited thereto. In other embodiments, the light-emitting colors of the first micro light-emitting device LED1, the second micro light-emitting device LED2, and the third micro light-emitting device LED3 are the same as each other, and quantum dots (QD) are used for color conversion.

The micro light-emitting device LED includes a first electrode E1, a second electrode E2 and a light-emitting structure layer ES. For example, the light-emitting structure layer ES may include a first type semiconductor layer (not illustrated), a light-emitting layer (not illustrated), a second type semiconductor layer (not illustrated), and an insulation layer (not illustrated), where the first electrode E1 and the second electrode E2 are located on a same side of the first type semiconductor layer or the second type semiconductor layer, and penetrate through the insulation layer to electrically connect the first type semiconductor layer and the second type semiconductor layer, respectively. Namely, the micro light-emitting device LED of the embodiment is a flip-chip type micro light-emitting diode device, but the invention is not limited thereto. Particularly, a ratio of a length of the micro light-emitting device LED in the direction Y to a thickness in the direction Z is greater than one.

In the embodiment, the conductive patterns CP of the first metal layer 110 include a plurality of first conductive patterns CP1, a plurality of second conductive patterns CP2, and a plurality of third conductive patterns CP3, and each pixel region (or opening 150a) is provided with three first conductive patterns CP1, one second conductive pattern CP2, and three third conductive patterns CP3. For example, the first conductive patterns CP1, the second conductive pattern CP2, and the third conductive patterns CP3 are arranged in alternation along the direction Y, and the second conductive pattern CP2 extends along the direction X from one side of the light-emitting display unit 10 to the other side (as shown in FIG. 4). Namely, the second conductive patterns CP2 of the pixel regions arranged along the direction X are connected to each other.

On the other hand, the first conductive patterns CP1 and the second conductive patterns CP2 used for bonding the micro light-emitting devices LED with the same light-emitting color in a plurality of pixel regions arranged in the direction Y may be electrically connected to the same transfer pattern TP of the second metal layer 120, and each transfer pattern TP is electrically connected to a corresponding pad pattern PP in the third metal layer 130 through a corresponding second contact window 142c. To be specific, through the above electrical connection relationship between the conductive patterns CP and the transfer patterns TP, the number of the pad patterns PP required by the light-emitting display unit 10 may be effectively reduced, which helps improving a bonding yield of the light-emitting display unit 10.

Therefore, in the embodiment, the number of the first contact windows 141c of the first insulation layer 141 is greater than the number of the second contact windows 142c of the second insulation layer 142, and the number of the second contact windows 142c is equal to the number of the pad patterns PP of the third metal layer 130. For example, the number of the pixel regions defined by the openings 150a of the isolation structure 150 in the direction X is M (for example, four), and the number of the pixel regions in the direction Y is N (for example, four), and the number of the second contact windows 142c of the second insulation layer 142 may be M+3N (for example, sixteen). More specifically, the number of the pad patterns PP of the third metal layer 130 may be determined by the numbers of the pixel regions (or openings 150a) arranged in the direction X and direction Y, and the number of the micro light-emitting devices LED arranged in each pixel region.

Further, the conductive patterns CP of the first metal layer 110 respectively have a plurality of portions for electrically bonding a plurality of micro light-emitting devices LED and a plurality of repairing micro light-emitting devices. For example, the first electrode E1 and the second electrode E2 of the micro light-emitting device LED are suitable for electrically connecting a portion CP1a of the first conductive pattern CP1 and a portion CP2a of the second conductive pattern CP2. Particularly, in the embodiment, the portion CP2a of the second conductive pattern CP2 and a portion CP3a of the third conductive pattern CP3 may be used as a connection pad set for repair. When a certain micro light-emitting device LED in any pixel region cannot be enabled during an inspection process, the reserved connection pad set may be used to bond a repairing micro light-emitting device (such as a micro light-emitting device LED2r in FIG. 9) to replace the damaged or disabled micro light-emitting device LED. Accordingly, a probability of the light-emitting display unit 10 being scrapped due to damage or failure of a part of the micro light-emitting devices LED may be reduced, thereby improving the production yield of the light-emitting display unit 10.

It should be noted that the portions of the conductive patterns CP located in the openings 150a (for example: the portion CP1a of the first conductive pattern CP1, the portion CP2a of the second conductive pattern CP2, and the portion CP3a of the third conductive pattern CP3) are completely overlapped with the pad patterns PP of the third metal layer 130 in the direction Z. In this way, the surface flatness of the portions of the conductive patterns CP used for bonding the micro light-emitting devices LED may be further increased, which helps improving a transposition yield of the micro light-emitting devices LED.

On the other hand, in order to further increase the surface flatness of one side of the light-emitting display unit 10 used for bonding the micro light-emitting devices LED, at least one of the first metal layer 110 and the second metal layer 120 may selectively include a plurality of dummy patterns. For example, in the embodiment, the first metal layer 110 further has a plurality of dummy patterns DP, and the dummy patterns DP are disposed between the conductive patterns CP and electrically insulated from the conductive patterns CP (as shown in FIG. 4). Similarly, the second metal layer 120 further has a plurality of dummy patterns DP', and the dummy patterns DP' are disposed between the transfer patterns TP and electrically insulated from the transfer patterns TP (as shown in FIG. 5).

Furthermore, the light-emitting display unit 10 may further include an adhesive layer 200 and a substrate 300. The adhesive layer 200 is disposed between the micro light-emitting devices LED and the substrate 300, and is connected to the substrate 300, a part of the surface of the first insulating layer 141, a part of the surface of the first metal layer 110, the micro light-emitting devices LED and the isolation structure 150. In particular, the light-emitting surface 10s of the light-emitting display unit 10 may be defined on one side surface of the substrate 300 facing away from the adhesive layer 200. A material of the adhesive layer 200 includes optical clear adhesive (OCA), optical clear resin (OCR), or other suitable optical adhesive materials. It should be noted that by configuring the dummy patterns DP of the first metal layer 110 and the dummy patterns DP' of the second metal layer 120, it may prevent accumulation of bubbles at an interface of the substrate 300 and the adhesive layer 200 during a bonding process of the substrate 300, which helps improving the production yield of the light-emitting display unit 10.

The substrate 300 is composed of a transparent material, such as glass, sapphire or epoxy resin, and a thickness of the substrate 300 is greater than 100 such as 250 μm. The substrate 300 with a relatively thick thickness may be regarded as a light guide layer, which may uniformly mix the light (such as red light, green light and blue light) emitted by multiple micro light-emitting devices LEDs located in the same pixel region (i.e., the opening 150a), which helps improving light-emitting uniformity of each pixel region.

Particularly, the light-emitting display unit 10 of the embodiment is suitable for splicing display apparatuses with various display sizes and non-rectangular outlines. For example, in a display apparatus 1 of an embodiment, a plurality of (for example, twelve) light-emitting display units 10 may be electrically connected to a same printed circuit board (PCB) 100 (as shown in FIG. 7). It should be noted that the number of the PCB 100 of the display apparatus 1 in FIG. 7 is, for example, one, which does not mean that the invention is limited by the content of the drawing. In other embodiments, the number and size of the PCBs of the display apparatus may also be adjusted according to actual design requirements (for example, an outline of the display apparatus in a line of sight).

Referring to FIG. 2, FIG. 7 and FIG. 8 at the same time, in order to reduce the risk of damaging the light-emitting display unit 10 due to excessive extrusion during a bonding process with the PCB 100 (for example, lines of metal layers are broken or film layers of insulation layers are broken), the light-emitting display unit 10 may selectively include a protective layer 160 disposed on one side of the third metal layer 130 away from the second metal layer 120. The protective layer 160 has a plurality of openings 160a corresponding to the pad patterns PP to expose a part of a surface of the pad patterns PP. It should be noted that orthogonal projections of the micro light-emitting devices LED in each pixel region on the third metal layer 130 are overlapped with the openings 160a of the protective layer 160, thereby ensuring that the surface of light-emitting display unit 10 used for bonding the respective micro light-emitting devices LED has substantially the same flatness.

For example, the PCB 100 is provided with a barrier layer 105, a plurality of bonding pads BP, and a plurality of solder bumps SB arranged corresponding to the bonding pads BP. The barrier layer 105 is disposed between the bonding pads BP, and is used to support the protective layer 160 of the light-emitting display unit 10. The solder bumps SB are disposed between the barrier layers 105 and are adapted to extend into the openings 160a of the protective layer 160 of the light-emitting display unit 10 to electrically bond the pad patterns PP of the light-emitting display unit 10. To be specific, the pad patterns PP of the light-emitting display unit 10 are bonded to the bonding pads BP via the solder bumps SB to electrically connect the PCB 100. A material of the protective layer 160 includes, for example, a (black or green) resin material, a colloidal material doped with absorbing particles (for example: carbon powder, vinyl), or other suitable organic materials.

It should be noted that based on a mating relationship between the protective layer 160 of the light-emitting display unit 10 and the barrier layer 105 of the PCB 100, a situation that the solder bumps SB in a molten state due to heat overflows to the adjacent bonding pads BP to cause electrical short circuits of a part of the bonding pads BP during a process of bonding the light-emitting display unit 10 to the PCB 100 is avoided. In other words, a bonding yield of the light-emitting display unit 10 and the PCB 100 may be improved.

In the embodiment, a thickness t8 of the protective layer 160 in the thickness direction (for example, the direction Z) may be selectively greater than the thickness t1 of the first insulation layer 141 and the thickness t2 of the second insulation layer 142. In this way, the surface flatness of the light-emitting display unit 10 on the side where the protective layer 160 is provided may be further increased. On the other hand, in the embodiment, materials of the protective layer 160 and the isolation structure 150 may be selectively the same, and by equalizing the thickness t8 of the protective layer 160 and the thickness t6 of the isolation structure 150, a stress distribution of the light-emitting display unit 10 is more even, which helps improving flexibility of the light-emitting display unit 10. For example, the thickness t8 of the protective layer 160 may be within a range of 10 μm to 20 μm.

On the other hand, a percentage of an orthogonal projection area of the protective layer 160 on a surface PPs of the pad patterns PP to an area of the surface PPs of the pad patterns PP is between 20% and 50%, so as to avoid a peeling phenomenon of the second insulation layer 142 around the pad patterns PP, and provide proper protection for a part of the third metal layer 130. For example, in the embodiment, an orthogonal projection contour of the pad pattern PP of the third metal layer 130 on an XY plane is a circle, and has a width W1 (i.e., a circle diameter) in any direction of the XY plane. Similarly, an orthogonal projection contour of the opening 160a of the protective layer 160 on the XY plane is a circle, and has a width W2 (i.e., a circle diameter) in any direction of the XY plane, where the width W2 of the opening 160a of the protective layer 160 may be less than the width W1 of the pad pattern PP. However, the invention is not limited thereto, in other embodiments, the width W2 of the opening 160a of the protective layer 160 may also be equal to the width W1 of the pad pattern PP. Namely, the surface of the protective layer 160 defining the opening 160a may be aligned with an outer edge of the pad pattern PP.

Since the light-emitting display unit 10 is provided with a plurality of metal layers electrically connected between the micro light-emitting devices LED and the PCB 100, the number of film layers on the PCB 100 may be simplified. In other words, a design margin of the overall circuit of the display apparatus 1 may be effectively increased. On the other hand, when the size of the display apparatus 1 is increased, by using different numbers of pre-made light-emitting display units 10 to perform transposition, the manufacturing process of the display apparatus 1 may be simplified, and meanwhile difficulty in repairing the large-size display apparatus 1 is reduced, which helps improving a production yield of the display apparatus 1.

Figure 9:
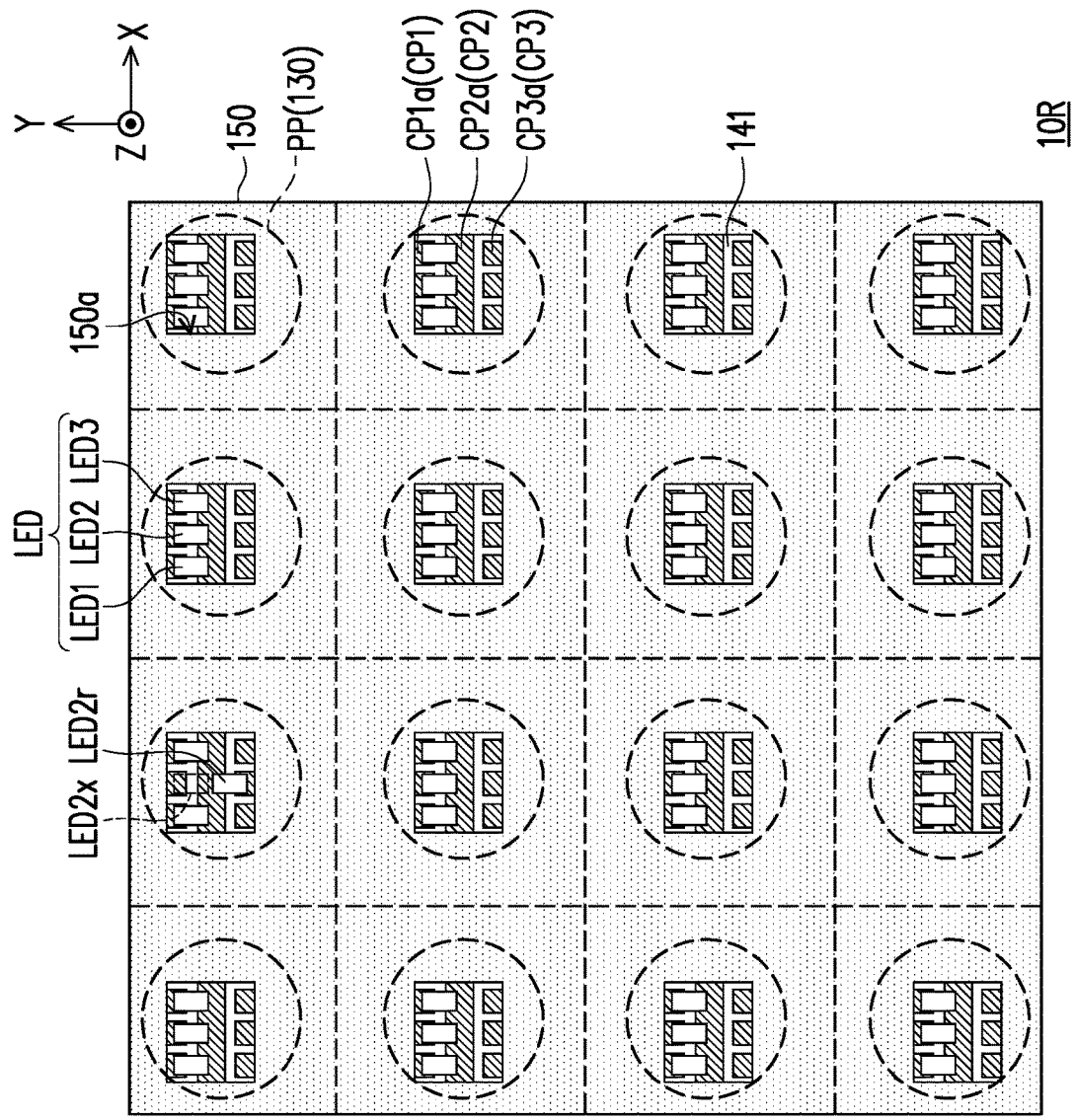
FIG. 9 is a schematic top view of a light-emitting display unit according to another embodiment of the invention.

FIG. 9 is a schematic top view of a light-emitting display unit according to another embodiment of the invention. Referring to FIG. 9, a difference between a light-emitting display unit 10R of the embodiment and the light-emitting display unit 10 of FIG. 1 is that the light-emitting display unit 10R of the embodiment is a repaired light-emitting display unit. For example, when the second micro light-emitting device LED2 in a pixel region of the light-emitting display unit 10 is inspected as a failed or damaged micro light-emitting device LED2x during the manufacturing process, the reserved connection pad set (such as the portion CP2a of the second conductive pattern CP2 and the portion CP3a of the third conductive pattern CP3) is used to bond a repairing micro light-emitting device LED2r to replace the damaged or failed micro light-emitting device LED2x.

It should be understood that before the repairing micro light-emitting device LED2r is bonded to the repairing connection pad set, the micro light-emitting device LED2x inspected as failed or damaged may be removed from the light-emitting display unit first. Alternatively, after the repairing micro light-emitting device LED2r is bonded to the repairing connection pad set, the micro light-emitting device LED2x inspected as failed or damaged is removed from the light-emitting display unit. However, the invention is not limited thereto, and in other embodiments, the repair process of the light-emitting display unit may not include the step of removing the failed or damaged micro light-emitting device. In other words, the replaced micro light-emitting device may still be remained on the repaired light-emitting display unit.

In summary, in the light-emitting display unit of an embodiment of the invention, the conductive patterns of the first metal layer are electrically connected to the pad patterns of the third metal layer through the transfer patterns of the second metal layer, respectively. Based on the fact that the distribution density of the second metal layer is greater than the distribution density of the first metal layer and the distribution density of the third metal layer, and the distribution density of the first metal layer is greater than the distribution density of the third metal layer, a surface flatness of the light-emitting unit configured with the conductive patterns may be effectively increased, and a transposition (transferring and positioning) yield of the micro light-emitting devices is therefore improved. A plurality of the light-emitting display units are adapted to be electrically connected to the printed circuit board through the respective pad patterns to form a display apparatus. The pre-made light-emitting display units may simplify the circuit layers disposed on the printed circuit board, making the display apparatus lighter and thinner. In a manufacturing process of the display apparatus, to transfer multiple light-emitting display units is more efficient and easier than transferring multiple micro light-emitting devices, and it may also reduce the difficulty of repairing a large-size display apparatus (for example: light-emitting inspection may be directly performed on the light-emitting display unit, and if there is a defective spot, it may be directly repaired to ensure that the micro light-emitting devices on the light-emitting display units function normally; then, each of the light-emitting display units passing the inspection is bonded to the printed circuit board through the respective pad patterns to form the display apparatus). The production yield of the display apparatus is accordingly improved. On the other hand, by configuring the metal layers of the light-emitting display unit, a design margin of the overall circuit of the display apparatus is effectively increased.

What is claimed is:

1. A light-emitting display unit, comprising:
   a first metal layer, having a plurality of conductive patterns;
   a second metal layer, having a plurality of transfer patterns electrically connected to the conductive patterns;
   a third metal layer, having a plurality of pad patterns electrically connected to the transfer patterns, the second metal layer is located between the first metal layer and the third metal layer, wherein a distribution density of the second metal layer is greater than a distribution density of the first metal layer, and the distribution density of the first metal layer is greater than a distribution density of the third metal layer;
   a first insulation layer, disposed between the first metal layer and the second metal layer;
   a second insulation layer, disposed between the second metal layer and the third metal layer; and
   a plurality of micro light-emitting devices, disposed on one side of the first metal layer away from the second metal layer, and electrically bonded to the conductive patterns, wherein a ratio of a length to a thickness of each micro light-emitting device is greater than one.

2. The light-emitting display unit as claimed in claim 1, wherein the first insulation layer has a plurality of first contact windows, the conductive patterns are electrically connected to the transfer patterns through the first contact windows, the second insulation layer has a plurality of second contact windows, and the transfer patterns are electrically connected to the pad patterns through the second contact windows, wherein a number of the first contact windows of the first insulation layer is greater than a number of the second contact windows of the second insulation layer.

3. The light-emitting display unit as claimed in claim 2, wherein the first contact windows and the second contact windows are not overlapped with the micro light-emitting devices.

4. The light-emitting display unit as claimed in claim 1, further comprising:
a protective layer, disposed on one side of the third metal layer away from the second metal layer and have a plurality of openings, and the openings of the protective layer expose a part of a surface of the third metal layer, wherein orthogonal projections of the micro light-emitting devices on the third metal layer are overlapped with the openings.

5. The light-emitting display unit as claimed in claim 4, wherein a thickness of the protective layer in a thickness direction is greater than a thickness of each of the first insulation layer and the second insulation layer in the thickness direction, and the thickness of each of the first insulation layer and the second insulation layer in the thickness direction is greater than or equal to a thickness of each of the first metal layer, the second metal layer and the third metal layer in the thickness direction.

6. The light-emitting display unit as claimed in claim 1, wherein a thickness of the first metal layer in the thickness direction is less than a thickness of each of the second metal layer and the third metal layer in the thickness direction.

7. The light-emitting display unit as claimed in claim 1, wherein a percentage of an orthogonal projection area of each of the first metal layer and the second metal layer on a light-emitting surface of the light-emitting display unit to an area of the light-emitting surface is greater than or equal to 70%.

8. The light-emitting display unit as claimed in claim 1, wherein a percentage of an orthogonal projection area of the third metal layer on a light-emitting surface of the light-emitting display unit to an area of the light-emitting surface is less than 50% and greater than 25%.

9. The light-emitting display unit as claimed in claim 1, further comprising:
an isolation structure, disposed on one side of the first metal layer provided with the micro light-emitting devices, the isolation structure has a plurality of openings, and the micro light-emitting devices are respectively disposed in the openings of the isolation structure, wherein a thickness of the isolation structure in a thickness direction is greater than or equal to a thickness of the micro light-emitting devices in the thickness direction.

10. The light-emitting display unit as claimed in claim 9, wherein a thickness of the isolation structure in the thickness direction is equal to a thickness of the protective layer in the thickness direction.

11. The light-emitting display unit as claimed in claim 9, wherein a percentage of an orthogonal projection area of the isolation structure on a light-emitting surface of the light-emitting display unit to an area of the light-emitting surface is greater than or equal to 70%.

12. The light-emitting display unit as claimed in claim 2, wherein the micro light-emitting devices are respectively located in a plurality of pixel regions of the light-emitting display unit, each pixel region has at least three micro light-emitting devices, a number of the pixel regions arranged in a first direction is M, a number of the pixel regions arranged in a second direction is N, the first direction is intersected with the second direction, and a number of the second contact windows of the second insulation layer is M+3N.

13. The light-emitting display unit as claimed in claim 1, further comprising:
a substrate, overlapped with the micro light-emitting devices, and the micro light-emitting devices are located between the substrate and the first metal layer; and
an adhesive layer, connecting the substrate, the micro light-emitting devices and a part of a surface of the first metal layer.

14. The light-emitting display unit as claimed in claim 1, wherein the first metal layer further has a plurality of dummy patterns, and the dummy patterns are electrically insulated from the conductive patterns.

15. The light-emitting display unit as claimed in claim 1, wherein a stacked structure within an orthogonal projection range of each of the micro light-emitting devices on the corresponding pad pattern is the same.

16. A display apparatus, comprising:
a printed circuit board; and
a plurality of light-emitting display units, electrically bonded to the printed circuit board, and each of the light-emitting display units comprises:
a first metal layer, having a plurality of conductive patterns;
a second metal layer, having a plurality of transfer patterns electrically connected to the conductive patterns;
a third metal layer, having a plurality of pad patterns electrically connected to the transfer patterns, the second metal layer is located between the first metal layer and the third metal layer, wherein a distribution density of the second metal layer is greater than a distribution density of the first metal layer, and the distribution density of the first metal layer is greater than a distribution density of the third metal layer;
a first insulation layer, disposed between the first metal layer and the second metal layer;
a second insulation layer, disposed between the second metal layer and the third metal layer; and
a plurality of micro light-emitting devices, disposed on one side of the first metal layer away from the second metal layer, and electrically bonded to the conductive patterns, wherein a ratio of a length to a thickness of each micro light-emitting device is greater than one.

17. The display apparatus as claimed in claim 16, wherein the printed circuit board has a plurality of solder bumps, and the pad patterns of the light-emitting display units are electrically bonded to the printed circuit board through the solder bumps.

18. The display apparatus as claimed in claim 17, wherein each of the light-emitting display units further comprises:
a protective layer, disposed on one side of the third metal layer away from the second metal layer, the protective layer directly covering a part of a surface of the pad patterns of the third metal layer, and a plurality of openings of the protective layer expose another part of the surface of the pad patterns, wherein the solder bumps respectively extend into the openings of the protective layer to connect the pad patterns.

19. The display apparatus as claimed in claim 18, wherein a percentage of an orthogonal projection area of the protective layer on a surface of the pad patterns to an area of the surface of the pad patterns is between 20% and 50%.

* * * * *